United States Patent
Numata

(10) Patent No.: US 9,627,427 B2
(45) Date of Patent: Apr. 18, 2017

(54) SOLID-STATE IMAGE SENSOR AND IMAGE CAPTURING APPARATUS USING THE SAME

(71) Applicant: CANON KABUSHIKI KAISHA, Tokyo (JP)

(72) Inventor: Aihiko Numata, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/908,821

(22) PCT Filed: Jul. 28, 2014

(86) PCT No.: PCT/JP2014/003950
§ 371 (c)(1),
(2) Date: Jan. 29, 2016

(87) PCT Pub. No.: WO2015/015790
PCT Pub. Date: Feb. 5, 2015

(65) Prior Publication Data
US 2016/0172390 A1 Jun. 16, 2016

(30) Foreign Application Priority Data

Jul. 31, 2013 (JP) .................................. 2013-159139

(51) Int. Cl.
*H01L 31/0232* (2014.01)
*H01L 27/146* (2006.01)

(52) U.S. Cl.
CPC .... *H01L 27/1463* (2013.01); *H01L 27/14605* (2013.01); *H01L 27/14623* (2013.01);
(Continued)

(58) Field of Classification Search
CPC .......... H01L 27/1463; H01L 27/14636; H01L 27/14625; H01L 27/14605;
(Continued)

(56) References Cited

U.S. PATENT DOCUMENTS

| 7,868,285 B2 * | 1/2011 | Konno | ................. G02B 3/0006 250/208.1 |
| 2007/0146531 A1 * | 6/2007 | Toshikiyo | ............ G02B 5/1876 348/340 |

(Continued)

FOREIGN PATENT DOCUMENTS

| JP | 2007-158109 A | 6/2007 |
| JP | 2008-071972 A | 3/2008 |

(Continued)

*Primary Examiner* — Victor A Mandala
(74) *Attorney, Agent, or Firm* — Canon USA, Inc. IP Division

(57) ABSTRACT

The present invention provides a solid-state image sensor in which degradation in image quality can be reduced. The solid-state image sensor includes an optical isolation layer between a pupil dividing unit and a plurality of photoelectric conversion units. The optical isolation layer includes a plurality of high-refractive-index areas and a low-refractive-index area having a lower refractive index than that of the high-refractive-index areas. The high-refractive-index areas are disposed above the photoelectric conversion units, and the low-refractive-index area is disposed between the high-refractive-index areas. The refractive index changes stepwise at the boundaries between the high-refractive-index areas and the low-refractive-index area. The refractive index difference of the stepwise changing portion is 0.15 or more. A value obtained by multiplying the physical thickness of the optical isolation layer by the refractive index of the high-refractive-index areas is 2.0 or less times as large as the wavelength of incident light.

23 Claims, 19 Drawing Sheets

(52) U.S. Cl.
CPC .. *H01L 27/14625* (2013.01); *H01L 27/14627* (2013.01); *H01L 27/14629* (2013.01); *H01L 27/14636* (2013.01)

(58) Field of Classification Search
CPC ......... H01L 27/14623; H01L 27/14627; H01L 27/14629
See application file for complete search history.

(56) References Cited

U.S. PATENT DOCUMENTS

| | | | |
|---|---|---|---|
| 2007/0215912 A1* | 9/2007 | Kido | H01L 27/14603 257/257 |
| 2009/0020690 A1* | 1/2009 | Toda | G02B 5/188 250/227.2 |
| 2012/0119068 A1 | 5/2012 | Numata | |
| 2012/0133809 A1 | 5/2012 | Yamada | |
| 2012/0202307 A1* | 8/2012 | Suzuki | H01L 27/14609 438/57 |
| 2012/0212656 A1* | 8/2012 | Hiramoto | H01L 27/14621 348/294 |
| 2014/0168485 A1* | 6/2014 | Hiramoto | H01L 27/14621 348/272 |

FOREIGN PATENT DOCUMENTS

| | | |
|---|---|---|
| JP | 2009-158800 A | 7/2009 |
| JP | 2011-096732 A | 5/2011 |
| JP | 4835136 B2 | 12/2011 |
| JP | 2012-151215 A | 8/2012 |
| JP | 2013-150314 A | 8/2013 |
| WO | 2013/094419 A1 | 6/2013 |

\* cited by examiner

SOLID-STATE IMAGE SENSOR AND IMAGE CAPTURING APPARATUS USING THE SAME

TECHNICAL FIELD

The present invention relates to a solid-state image sensor. In particular, the present invention relates to a solid-state image sensor for use in distance measurement in an image capturing apparatus.

BACKGROUND ART

For image capturing apparatuses, such as digital still cameras and video cameras, a solid-state image sensor is proposed in which part or all of pixels are ranging pixels having a distance measuring function (hereinafter referred to as ranging pixels). Such a solid-state image sensor can measure distance by a phase-difference detection method. The phase-difference detection method is a method for measuring distance by triangulation using a stereo image of light that has passes through different areas on the pupil of an imaging optical system. Unlike a conventional contrast method, the phase-difference detection method does not need to move a lens to measure distance, thus allowing high-speed high-precision autofocusing. The phase-difference detection method also allows real-time autofocusing at video recording.

In PTL 1, light that has passed through different areas of the pupil of a taking lens is collected to a plurality of different photoelectric conversion units with a pupil-dividing microlens. Thus, distance can be measured on the basis of signals detected at the different photoelectric conversion units of the ranging pixels. The signals detected at the plurality of photoelectric conversion units are combined for use as the values of the ranging pixels for generating a captured image.

CITATION LIST

Patent Literature

PTL 1: Japanese Patent No. 04835136

SUMMARY OF INVENTION

Technical Problem

In the ranging pixel disclosed in PTL 1, part of light that has entered areas between the plurality of photoelectric conversion units is held in crystal defects on the surface or in the areas into loss, thus decreasing the amount of light that can be received by the photoelectric conversion units of the ranging pixels. Other part of the light that has entered the areas is converted to electrons and diffuses into adjacent ranging pixels or the photoelectric conversion units of image-capturing pixels to change the value of the pixels, thus reducing the quality of the captured image. In particular, the use of the signals of the ranging pixels changes the values of the ranging pixels themselves due to the loss and crosstalk described above, thus degrading the quality of the image.

In consideration of the above problems, the present invention provides a solid-state image sensor in which degradation in the quality of a captured image can be reduced.

Solution to Problem

A solid-state image sensor according to an aspect of the present invention is a solid-state image sensor including a ranging pixel including a pupil dividing unit and a plurality of photoelectric conversion units. The pupil dividing unit is configured to divide light that has passed through an exit pupil of an imaging optical system, and the photoelectric conversion units is configured to receive the light that has passed though the pupil dividing unit. The ranging pixel includes an optical isolation layer between the pupil dividing unit and the plurality of photoelectric conversion units. The optical isolation layer includes a plurality of high-refractive-index areas and a low-refractive-index area having a lower refractive index than the refractive index of the high-refractive-index areas. The high-refractive-index areas are disposed above the plurality of photoelectric conversion units, and the low-refractive-index area is disposed between the plurality of the high-refractive-index areas. The refractive index changes stepwise at the boundaries between the high-refractive-index areas and the low-refractive-index area. The refractive index difference of the stepwise changing portion is 0.15 or more. A value obtained by multiplying the physical thickness of the optical isolation layer by the refractive index of the high-refractive-index areas is 2.0 or less times as large as the wavelength of incident light.

Further features of the present invention will become apparent from the following description of exemplary embodiments with reference to the attached drawings.

Advantageous Effects of Invention

The present invention can provide a solid-state image sensor in which degradation in the quality of a captured image can be reduced.

DESCRIPTION OF EMBODIMENTS

A solid-state image sensor according to embodiments of the present invention will be described hereinbelow with reference to the drawings. In all the drawings, components having the same functions are given the same reference signs and repeated descriptions thereof will be omitted.

First Embodiment

Figure 1A:
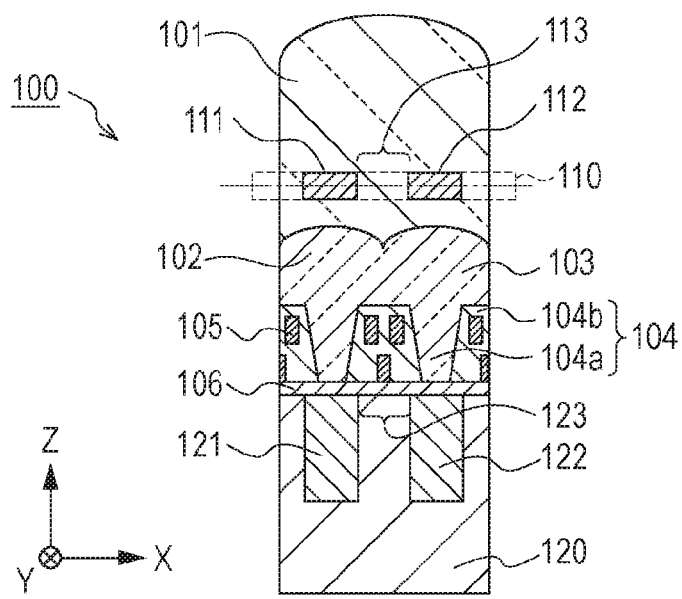
FIG. 1A is a schematic diagram of a ranging pixel of a solid-state image sensor according to a first embodiment.

FIG. 1A is a schematic diagram of a ranging pixel 100 disposed in part of a solid-state image sensor in a first embodiment. The ranging pixel 100 includes a microlens 101 serving as a pupil dividing unit, an optical isolation layer 110, two microlenses 102 for collecting light, a waveguide top layer 103, two waveguides 104, and photoelectric conversion units 121 and 122 in this order from the light incident side. The waveguides 104 are each constituted of a core 104a and a clad 104b. The microlens 101 divides light that has passed through the exit pupil of an imaging optical system of an image capturing apparatus, described later. More specifically, the microlens 101 introduces light that has passed through about half of the exit pupil of the imaging optical system to one of the microlenses 102 and light that has passed through the other half to the other of the microlenses 102 to form pupil divided light. The pupil divided light is guided in the core 104a and is received by the photoelectric conversion units 121 and 122.

The core 104a and the clad 104b can be formed with an inorganic substance, such as silicon oxide, silicon nitride, silicon oxynitride, silicon carbide, or boron phosphorus silicon glass (BPSG), or an organic substance, such as polymer or resin. Here, a combination of the materials of the core 104a and the clad 104b is selected so that the refractive index of the core 104a is larger than the refractive index of the clad 104b.

The photoelectric conversion units 121 and 122 are formed by forming a potential gradient in corresponding areas in a substrate 120 formed of a material having absorption in a wavelength band for detection, such as silicon, by ion implantation or the like. A potential barrier is formed between the photoelectric conversion units 121 and 122 to form a barrier area 123. The potential barrier may be formed by implanting ions not in the areas corresponding to the photoelectric conversion units 121 and 122 but in an area corresponding to the barrier area 123 to reduce the conductivity. Both of them may be executed. The clad 104b on the barrier area 123 has therein wires 105 for transferring electrical charge generated in the photoelectric conversion units 121 and 122 to a signal processing circuit, described later. A gettering layer 106 for preventing reflection of incident light and contamination of the photoelectric conversion units 121 and 122 is formed between the waveguides 104 and the substrate 120.

The microlens 101 is disposed astride the photoelectric conversion units 121 and 122. The microlens 101 selectively introduces light that has entered from a pupil area eccentric in the +x direction from the optical axis of the imaging optical system, described later, to the microlens 102 (the left) above the photoelectric conversion unit 121. The microlens 101 also selectively introduces light that has entered from a pupil area eccentric in the −x direction from the optical axis of the imaging optical system to the microlens 102 (the right) above the photoelectric conversion unit 122.

The microlens 101 introduces light that has passed through different pupil areas to the different photoelectric conversion units 121 and 122 in this way. The microlenses 102 and the waveguides 104 are disposed in correspondence with the individual photo electric conversion units 121 and 122 to efficiently introduce the light that has passed through the optical isolation layer 110 to the photoelectric conversion units 121 and 122.

The waveguide top layer 103 is disposed between the waveguides 104 and the microlenses 102. The waveguide top layer 103 is formed in the process of forming the waveguides 104 by embedding the cores 104a of the waveguides 104 with a material having a refractive index higher than that of the clads 104b of the waveguides 104 and then flattening the waveguides 104. The wires 105 are formed of polysilicon or metal, such as copper or aluminum.

The optical isolation layer 110 is disposed between the microlens 101 and the photoelectric conversion units 121 and 122. The optical isolation layer 110 has a plurality of high-refractive-index areas 111 and 112 disposed above the photoelectric conversion units 121 and 122, respectively. The optical isolation layer 110 also has a low-refractive-index area 113 having a refractive index lower than that of the high-refractive-index areas 111 and 112 between the high-refractive-index areas 111 and 112 and above the barrier area 123 between the photoelectric conversion units 121 and 122.

For example, a medium that forms the low-refractive-index area 113 may be silicon oxide, and a medium that forms the high-refractive-index areas 111 and 112 may be silicon nitride. Other examples of the medium that forms the high-refractive-index areas 111 and 112 and the medium that forms the low-refractive-index area 113 can be the materials used for the core 104a and clad 104b, described above. Another example of the medium that forms the high-refractive-index areas 111 and 112 may be the same as that of the core 104a Another example of the medium that forms the low-refractive-index area 113 may be the same as that of the clad 104b.

Figure 1B:
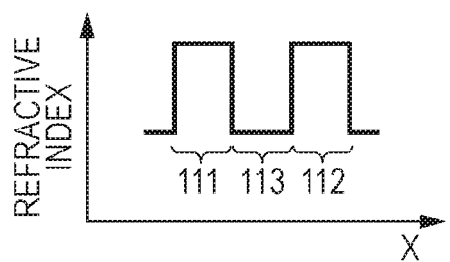
FIG. 1B is a diagram showing a change in the refractive index of an optical isolation layer.
Figure 1C:
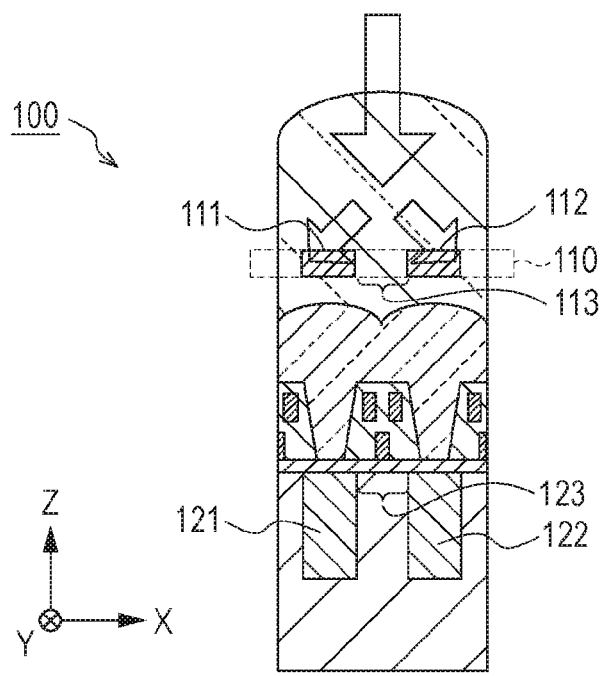
FIG. 1C is a diagram showing the state of light entering the optical isolation layer of the first embodiment.

FIG. 1B shows a change in refractive index in the vicinity of the center in the x-axis direction of the optical isolation layer 110. As described above, the refractive index changes stepwise at the boundaries between the high-refractive-index areas 111 and 112 and the low-refractive-index area 113 of the optical isolation layer 110. The high-refractive-index areas 111 and 112 are enclosed by the low-refractive-index areas 113 and a low refractive index medium (microlens 101) disposed closer to the pupil dividing unit than the high-refractive-index areas 111 and 112. Light has the characteristic of being refracted to a high-refractive-index medium than to a low refractive index medium. Thus, the configuration of the optical isolation layer 110 allows light directed to the low-refractive-index area 113 to be refracted to the high-refractive-index areas 111 and 112 so as not to enter the barrier area 123, as shown in FIG. 1C. This can reduce light that enters the barrier area 123, thus increasing the amount of light detected in the photoelectric conversion units 121 and 122. This can reduce degradation in image quality when the signals detected by the ranging pixel 100 are used for forming the captured image.

Incident-Angle Dependency of Sensitivity

Figure 2:
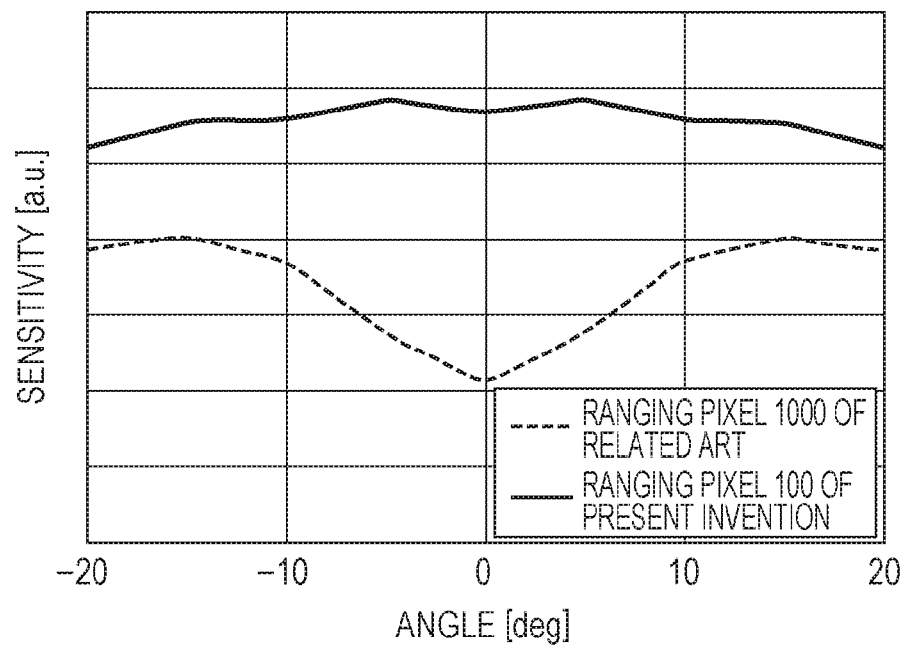
FIG. 2 is a graph showing a comparison between the sensitivity the ranging pixel according to the first embodiment and the sensitivity of a ranging pixel in the related art.
Figure 14A:
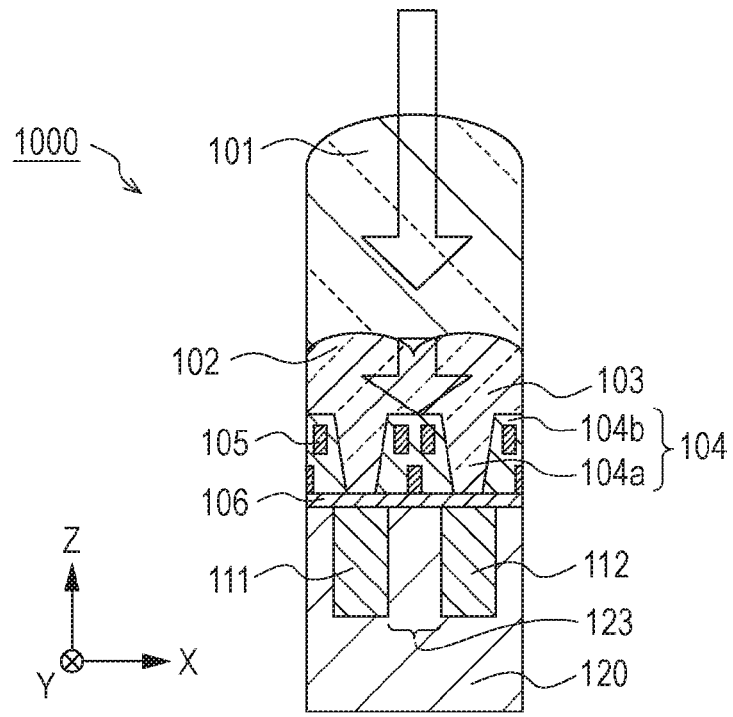
FIG. 14A is a schematic diagram of a ranging pixel in the related art.

FIG. 2 shows a comparison between the incident-angle dependency of the sensitivity of the ranging pixel 100 of the solid-state image sensor according to this embodiment and the incident-angle dependency of the sensitivity of a ranging pixel 1000 of a solid-state image sensor in the related art. The configuration of the ranging pixel 1000 in the related art is shown in FIG. 14A, which differs from the ranging pixel 100 in FIG. 1A in that the optical isolation layer 110 is not disposed. FIG. 2 shows that the ranging pixel 100 of this embodiment has higher sensitivity than that of the ranging pixel 1000 in the related art at every incident angle. The incident angles are with respect to the z-axis in FIG. 1A. For example, light at an incident angle of +10 degrees refers to light that enters at an angle inclined 10 degrees in the +x direction from the z-axis.

Figure 14B:
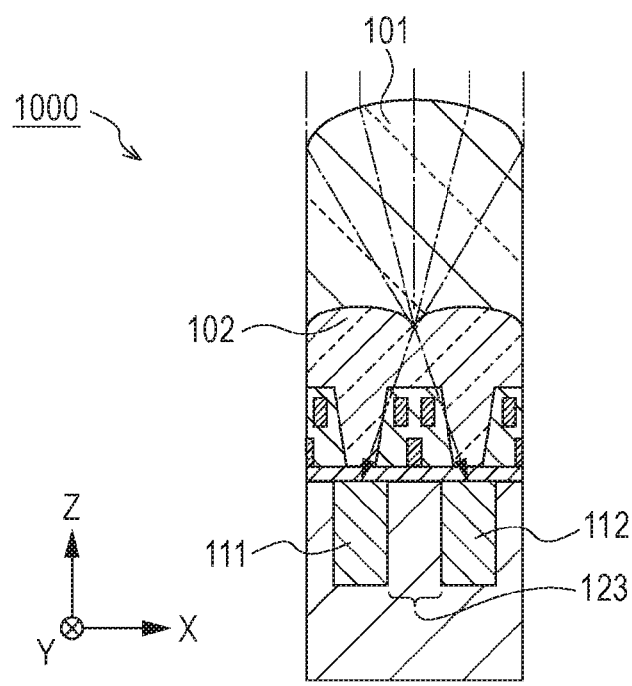
FIG. 14B is a schematic diagram illustrating the light propagation of the ranging pixel in the related art.
Figure 14C:
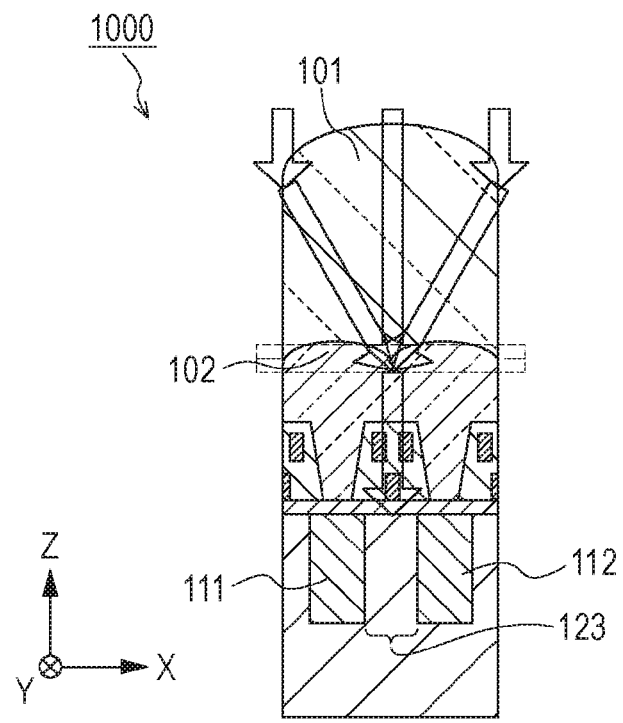
FIG. 14C is a schematic diagram illustrating the light propagation of the ranging pixel in the related art.
Figure 14D:
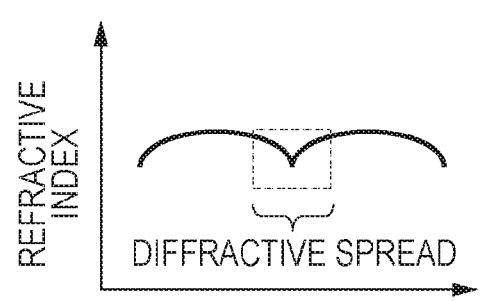
FIG. 14D is a graph showing changes in the refractive index of microlenses.

A cause of the increase in the sensitivity of the ranging pixel 100 of this embodiment from the ranging pixel in the related art will be described hereinbelow. FIG. 14B is a diagram illustrating the light propagation of the ranging pixel 1000 in the related art using ray tracing that takes a local refractive index difference into account, as in PTL 1. With the ray tracing, light collected to different positions depending on the incident angles by the microlens 101 is collected to corresponding photoelectric conversion units 121 and 122 by the microlenses 102. However, since light actually spreads due to diffraction, the light is not simply refracted due to a local refractive index difference, and the propagation of light depends on an average refractive index difference within the range of spread due to diffraction. In particular, as shown in FIG. 14C, light that has passed through the vicinity of the boundary between the microlenses 102 is influenced by continuous changes in the refractive indices of the two microlenses 102, shown in FIG. 14D. Thus, the light also enters the barrier area 123 while spreading.

In contrast, with the ranging pixel 100 of this embodiment, light enters the microlenses 102 after being refracted to the high-refractive-index area 111 or the high-refractive-index area 112 due to the stepwise refractive index difference of the optical isolation layer 110, as shown in FIG. 1C. This can decrease the amount of light entering the barrier area 123 and can increase the amount of light entering the photoelectric conversion units 121 and 122.

Furthermore, as shown in FIG. 2, with the ranging pixel 1000 in the related art, sensitivity to light that enters the substrate 120 in the vertical direction is lower than that to light that enters diagonally. This is because light that enters at an angle closer to the vertical direction enters the barrier area 123 more. The depression in the sensitivity-to-angle characteristic causes an unnatural image generated from the signals from the ranging pixel 1000. Specifically, if sensitivity to vertical light is 80% or less of the peak value of sensitivity, a doughnut-shaped blur is generated in the image.

In contrast, since the ranging pixel 100 of this embodiment refracts light, which enters the barrier area 123 with the ranging pixel 1000 in the related art, toward the high-refractive-index areas 111 and 112 in the optical isolation layer 110, the sensitivity to vertical incident light can be increased to the peak value or 80% or more of the peak value. This allows the ranging pixel 100 of this embodiment to have higher sensitivity than that of the ranging pixel 1000 in the related art and to obtain a more natural image.

Refractive Index Difference of Optical Isolation Layer

Figure 3:
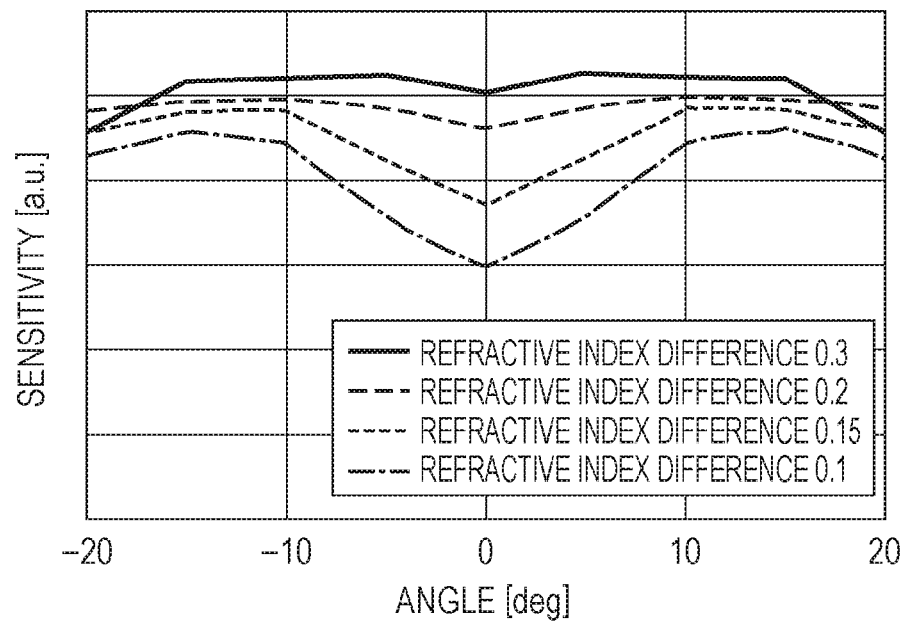
FIG. 3 is a graph of the incident-angle dependency of the ranging pixel according to the first embodiment.

In the optical isolation layer 110, the difference between the refractive index of a medium that forms the low-refractive-index area 113 and the refractive index of a medium that forms the high-refractive-index areas 111 and 112 may be larger. This is for the purpose of enhancing the effect of refracting light directed to the low-refractive-index area 113 toward the high-refractive-index area 111 or the high-refractive-index area 112. FIG. 3 shows the incident-angle dependency of the sensitivity of the ranging pixel 100 plotted against changes in the refractive index difference between a medium that forms the low-refractive-index area 113 and a medium that forms the high-refractive-index areas 111 and 112. FIG. 3 shows that the sensitivity of the ranging pixel 100 increases as the refractive index difference increases. In particular, with a refractive index difference of 0.15 or more, the sensitivity to vertical incident light (an angle of 0 degree) is 80% or more of the peak value. Thus, the refractive index difference of the stepwise change portion of the refractive index in the optical isolation layer 110 is preferably 0.15 or more. Furthermore, a refractive index difference of 0.30 or more of the stepwise change portion of the refractive index is more preferable because the sensitivity to vertical incident light (an angle of 0 degree) is substantially equal to the peak value. The refractive index difference of the stepwise change portion is preferably 0.50 or less in the viewpoint of a material usable as the optical isolation layer 110.

The stepwise change portion may be either one or a plurality of steps. The refractive index difference of the stepwise change portion of the refractive index refers to a refractive index difference at one step. In other words, that the refractive index difference of the stepwise change portion is 0.15 or more refers to that the refractive index difference is 0.15 or more at one step.

Optical Thickness of Optical Isolation Layer

To enhance the effect of the optical isolation layer 110, the physical thickness of the optical isolation layer 110 may be thick so that incident light can sense the stepwise changes in refractive index. Specifically, a value obtained by multiplying the physical thickness of the optical isolation layer 110 by the refractive index difference of the stepwise change portion is preferably 0.10 or more times as large as the wavelength the incident light. For example, if the wavelength of the incident light is 600 nm, and the refractive index difference is 0.30, the physical thickness of the optical isolation layer 110 is preferably 200 nm or more.

An excessively large thickness of the optical isolation layer 110 causes the optical isolation layer 110 to function as a waveguide to limit a waveguide mode for propagation. This causes light that cannot couple with the waveguide mode of the waveguide into loss, thus decreasing the sensitivity of the ranging pixel 100. Specifically, a value obtained by multiplying the physical thickness of the optical isolation layer 110 by the refractive index of the high-refractive-index areas 111 and 112 is preferably, 2.0 or less times as large as the wavelength of the incident light.

Width of Low-Refractive-Index Area

Figure 4A:
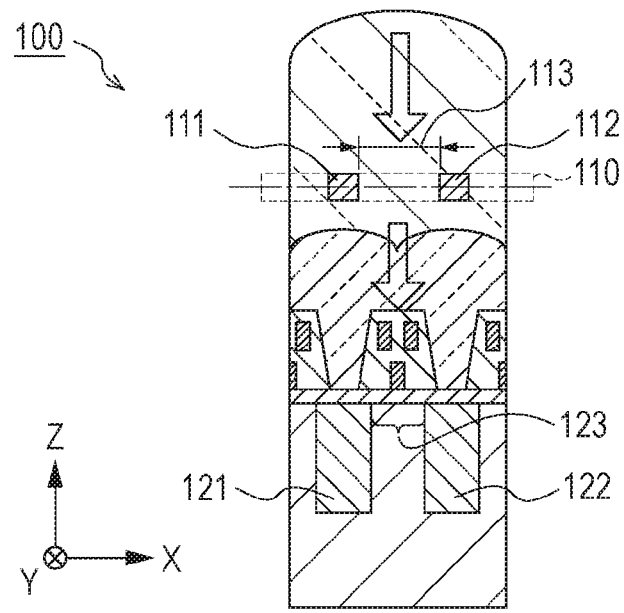
FIG. 4A is a diagram illustrating the state of light in the case where the width of a low-refractive-index area is large.
Figure 4B:
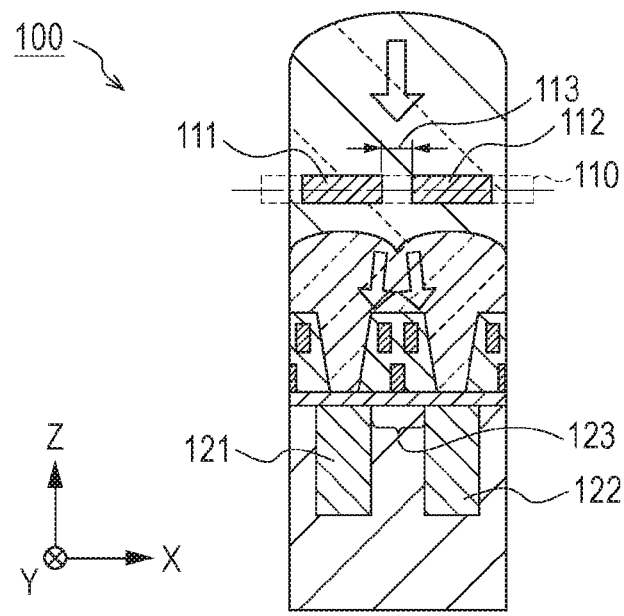
FIG. 4B is a diagram illustrating the stake of light in the case where the width of the low-refractive-index area is small.

FIG. 4A shows the state of light that has entered the vicinity of the center of the low-refractive-index area 113 in the case where the width of the low-refractive-index area 113 is large. In this case, the light that has entered the vicinity of the center of the low-refractive-index area 113 is not sufficiently influenced by the refractive index difference that changes stepwise in the optical isolation layer 110. This causes the light to directly enter the barrier area 123. In contrast, FIG. 4B shows the state of light that has entered the vicinity of the center of the low-refractive-index area 113 in the case where the width of the low-refractive-index area 113 is small. In this case, the light that has entered the vicinity of the center of the low-refractive-index area 113 directly enters the barrier area 123 without being sufficiently refracted. The width of the barrier area 123 is the distance between the photoelectric conversion units 121 and 122.

Figure 4C:
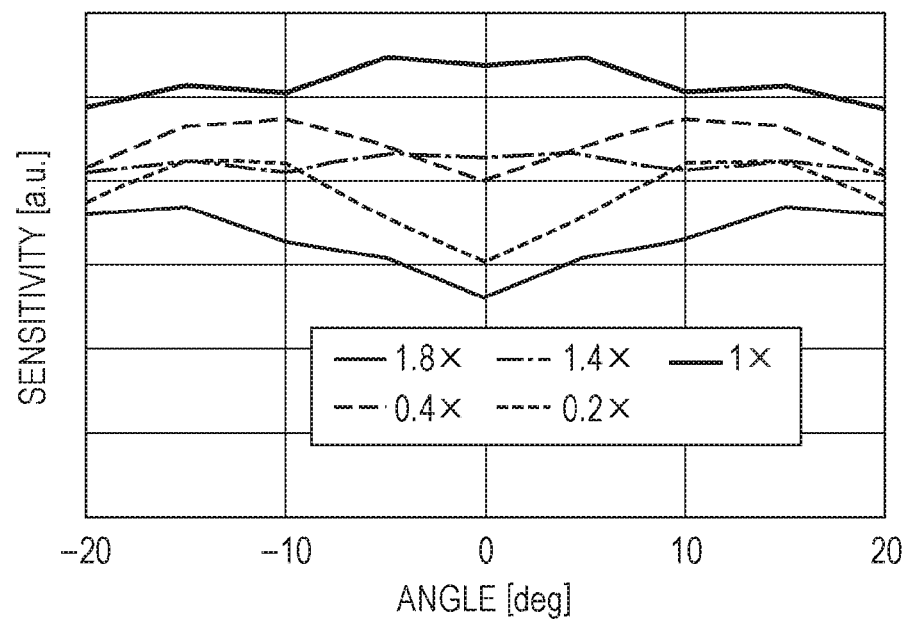
FIG. 4C is a diagram showing the incident-angle dependency of the sensitivity of the ranging pixel at different ratios of the width of the low-refractive-index area to that of the barrier area.

FIG. 4C shows the incident-angle dependency of the sensitivity of the ranging pixel 100 plotted against changes in the ratio of the width of the low-refractive-index area 113 to the width of the bather area 123. The examples in the graph show how many times larger the width of the low-refractive-index area 113 than the width of the barrier area 12. FIG. 4C shows that the sensitivity is high when the distance between the high-refractive-index areas 111 and 112, that is, the width of the low-refractive-index area 113, is equal to the width of the barrier area 123. The width of the low-refractive-index area 113 being 0.40 or more times and 1.4 or less times as large as the width of the barrier area 123 is preferable because the sensitivity to vertical incident light is 80% or more of the peak sensitivity.

Width of Step Portion of Refractive Index

Figure 5A:
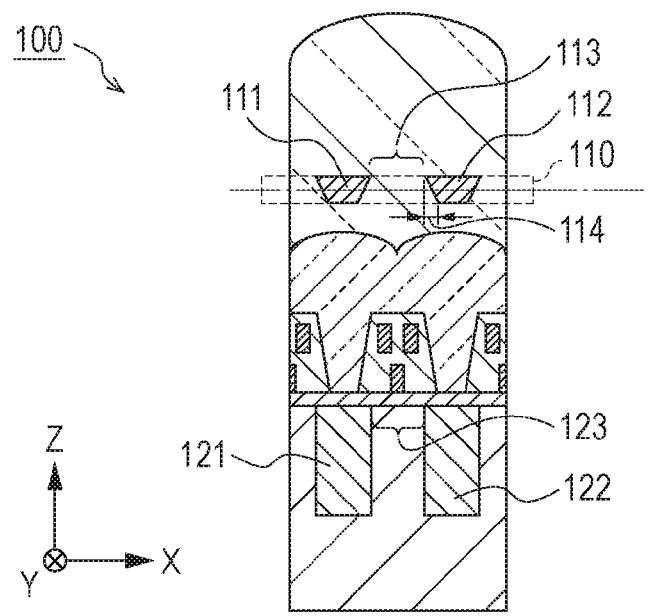
FIG. 5A is a diagram illustrating the shape of high-refractive-index areas in an optical isolation layer in the ranging pixel according to the first embodiment.

One of the following methods may be used to manufacture the optical isolation layer 110. One method is to grow a medium that forms the low-refractive-index area 113, thereafter remove portions above the photoelectric conversion units 121 and 122 by photolithography, and etch and fill the portions with a medium that forms the high-refractive-index areas 111 and 112. In this case, as shown in FIG. 5A, the high-refractive-index areas 111 and 112 generally have an inverted tapered shape that gradually decreases in size from the light incident side toward the photoelectric conversion units 121 and 122.

Figure 5B:
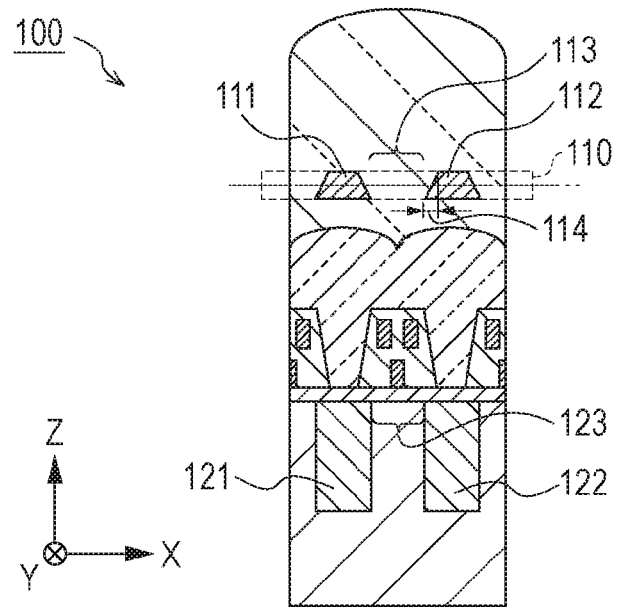
FIG. 5B is a diagram showing another example of the high-refractive-index areas according to the first embodiment.

Another method is to form a medium that forms the high-refractive-index areas 111 and 112, thereafter remove a portion above the barrier area 123, and to fill the portion with a medium that forms the low-refractive-index area 113. In this case, as shown in FIG. 5B, the high-refractive-index areas 111 and 112 generally have a forward tapered shape that gradually increases in size from the light incident side toward the photoelectric conversion units 121 and 122.

In both cases, the taper angle of the high-refractive-index areas 111 and 112 is preferably closer to 90 degrees because the width 114 of the stepwise change portion is small. The sufficiently small width 114 of the stepwise change portion relative to the spread of incident light allows the incident light to be influenced by discontinuous stepwise changes in refractive index. This allows light directed to the low-refractive-index area 113 to be efficiently separated to the high-refractive-index area 111 or the high-refractive-index area 112. In contrast, if the width 114 of the stepwise change portion is too large, incident light is not sufficiently influenced by the stepwise discontinuous changes in refractive index. This makes the separation function of the optical isolation layer 110 insufficient.

Figure 5C:
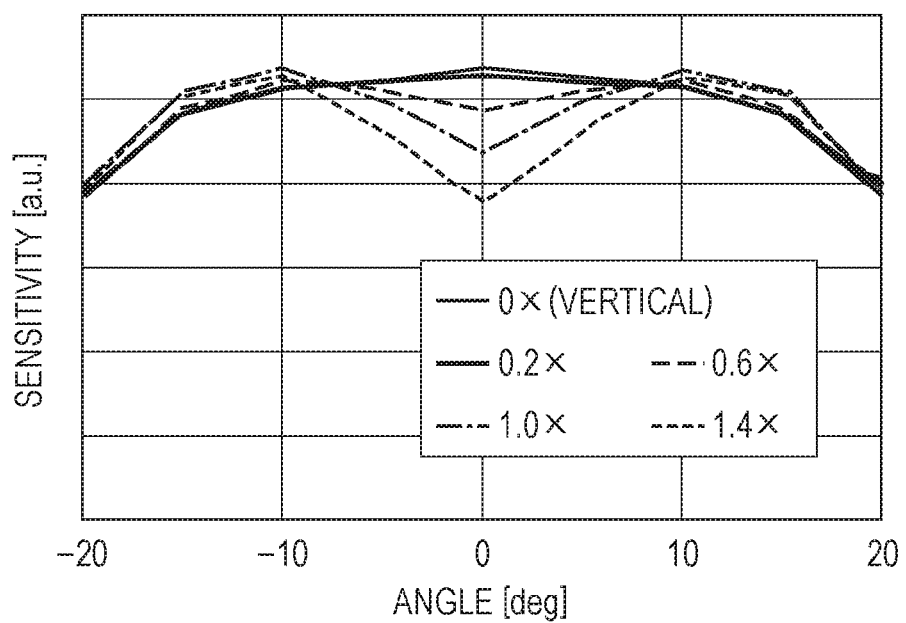
FIG. 5C is a diagram showing the incident-angle dependency of the sensitivity of the ranging pixel at different widths of the low-refractive-index area.

FIG. 5C shows the incident-angle dependency of the sensitivity of the ranging pixel 100 plotted, against changes in the width 114 of the stepwise change portion of the sides of the high-refractive-index areas 111 and 112. The examples in the graph show how many times larger the width 114 of the stepwise change portion than the wavelength of the incident light. FIG. 5C shows that the depression of sensitivity to vertical incident light decreases in size as the width 114 of the portion at which the refractive index changes stepwise decreases. In particular, when the width 114 of the portion at which the refractive index changes stepwise is equal to or less than the wavelength of the incident light, the sensitivity to vertical incident light is 80% or more of the peak sensitivity. Thus, the width 114 of the stepwise change portion is preferably less than or equal to the wavelength of the incident light. FIG. 5C also shows that when the width 114 of the stepwise change portion is 0.20 or less times as large as the wavelength of the incident light, substantially the same sensitivity as that when the width 114 of the stepwise change portion is zero (that is, the tapered angle is 90 degrees) can be obtained. Thus, the width of the portion 140 is more preferably 0.20 or less times as large as the wavelength of the incident light.

Modifications

The above embodiment shows an example in which the refractive index is changed stepwise by using different materials for the high-refractive-index areas 111 and 112 and the low-refractive-index area 113 of the optical isolation layer 110. However, an effective refractive index that incident light senses need only be changed stepwise.

In another configuration example, the high-refractive-index areas 111 and 112 or the low-refractive-index area 113 may be formed of a composite material in which a host medium and a guest medium are dispersed. If the sizes of the host medium area and the guest medium area are sufficiently smaller than the wavelength of incident light (deflective spread of light), the light is influenced by the host medium and the guest medium at the same time. Accordingly, the incident light senses not the refractive indices of the host medium and the guest medium themselves but an effective refractive index that depends on the volume filling factor of the guest medium. Thus, controlling the volume filling factor of the guest medium of the composite material can change the effective refractive index.

Figure 6A:
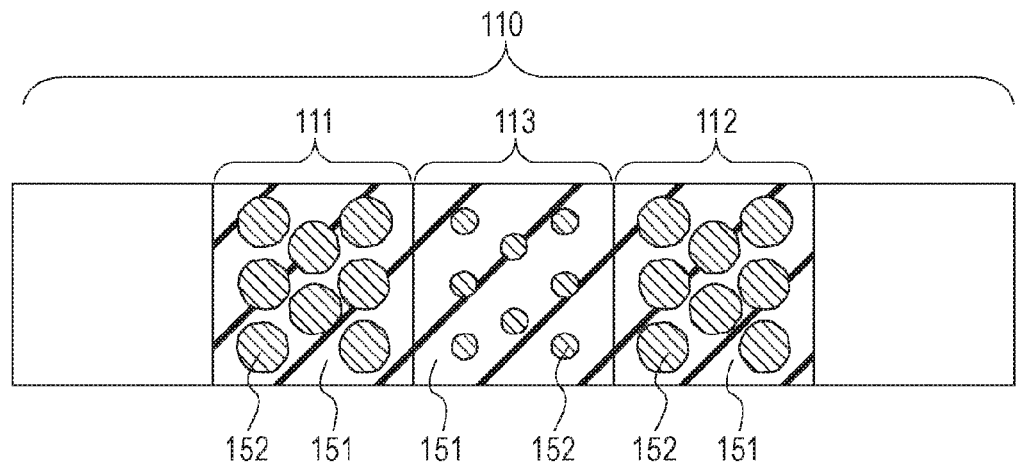
FIG. 6A is a schematic diagram showing another example of the optical isolation layer according to the first embodiment.
Figure 6B:
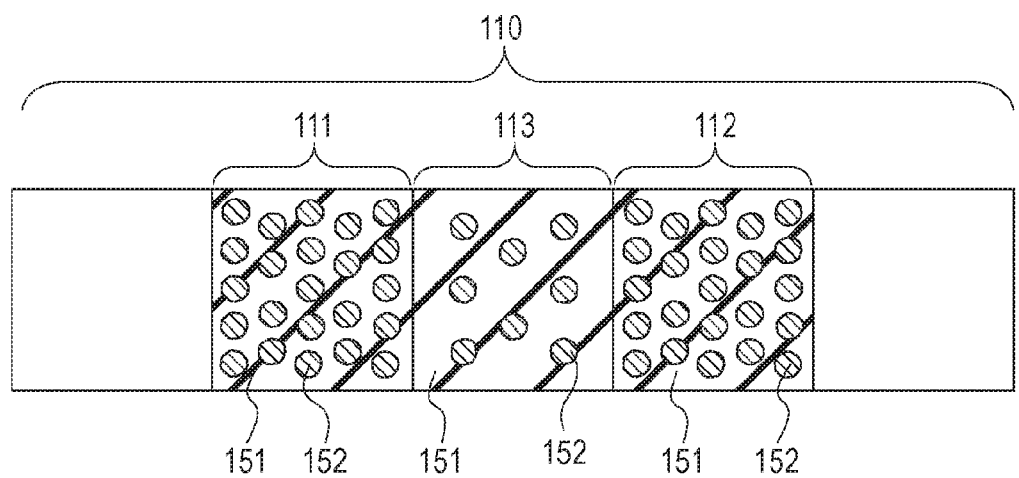
FIG. 6B is a schematic diagram showing yet another example of the optical isolation layer according to the first embodiment.

FIGS. 6A and 6B are schematic diagrams of the optical isolation layer 110. The high-refractive-index areas 111 and 112 the low-refractive-index area 113 of the optical isolation layer 110 is formed of a composite material. The high-refractive-index areas 111 and 112 and the low-refractive-index area 113 are formed of a composite material in which a guest medium 152 made of titanium dioxide having a higher refractive index than silicon dioxide is dispersed in a host medium 151 made of silicon dioxide. The volume density of the guest medium 152 increases stepwise from the low-refractive-index area 113 toward the high-refractive-index areas 111 and 112. Specifically, FIG. 6A shows a configuration in which the guest medium 152 in the high-refractive-index areas 111 and 112 is larger than that of the low-refractive-index area 113. In contrast, FIG. 6B shows a configuration in which the number density of the guest medium 152 in the high-refractive-index areas 111 and 112 is larger than that of the low-refractive-index area 113. This configuration allows the effective refractive index of the high-refractive-index areas 111 and 112 to be higher than the effective refractive index of the low-refractive-index area 113. This allows a stepwise refractive index to be achieved in the optical isolation layer 110.

In another example, the high-refractive-index areas 111 and 112 and the low-refractive-index area 113 may have a resonance structure with a size equal to or less than the wavelength. In metal particles or a structure, such as a split-ring resonator, light senses resonance that depends on the shape of the structure, depending on which an effective refractive index is determined. In the case where the high-refractive-index area and the low-refractive-index area have such a resonance structure, the effective refractive index can be changed by controlling the shape of the structure. Specifically, the effective refractive index can be increased as the resonance wavelength of the structure and the wavelength of incident light are closer to each other.

Figure 6C:
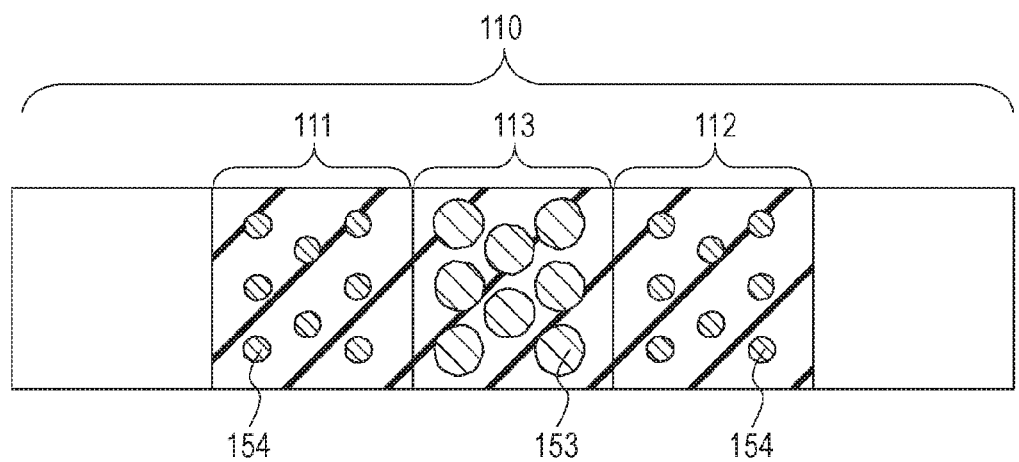
FIG. 6C is a schematic diagram showing still another example of the optical isolation layer according to the first embodiment.

FIG. 6C shows an example structure of the optical isolation layer 110 in which the high-refractive-index areas 111 and 112 and the low-refractive-index area 113 are formed of aluminum fine particles. With this structure, aluminum fine particles 153 contained in the low-refractive-index area 113 are larger than aluminum fine particles 154 in the high-refractive-index areas 111 and 112. The resonance wavelength of the aluminum fine particles 154 in the high-refractive-index areas 111 and 112 is closer to the wavelength of incident light than the resonance wavelength of the aluminum fine particles 153 in the low-refractive-index area 113. This structure allows the effective refractive index of the high-refractive-index areas 111 and 112 to be higher than the effective refractive index of the low-refractive-index area 113. Thus, the structure in FIG. 1A may be adopted.

If the refractive index increases stepwise from the low-refractive-index area 113 above the barrier area 123 toward the high-refractive-index areas 111 and 112, the low-refractive-index area may be disposed outside the ranging pixel 100, as shown in FIG. 1A, In other words, the refractive index may increase stepwise from outside the ranging pixel 100 toward above the photoelectric conversion units 121 and 122.

Figure 7A:
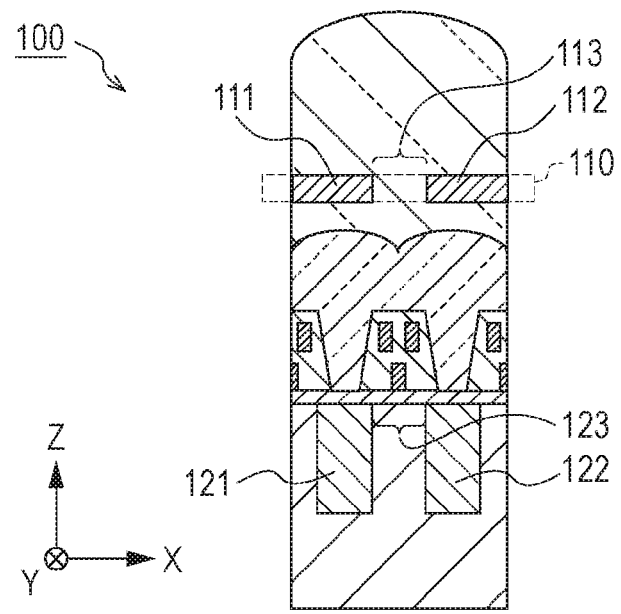
FIG. 7A is a schematic diagram showing another example of the ranging pixel according to the first embodiment.

Alternatively, as shown in FIG. 7A, the high-refractive-index areas 111 and 112 may extend to the outer side of the ranging pixel 100, so that the refractive index is constant from the outer side of the ranging pixel 100 toward above the photoelectric conversion units 121 and 122. This configuration allows a pattern for forming the high-refractive-index areas 111 and 112 in the optical isolation layer 110 to be thin, thus facilitating manufacture. In this case, for ranging pixels adjacent in the x-direction, the high-refractive-index areas 111 and 112 may be continuously disposed astride the two ranging pixels. However, providing the high-refractive-index areas 111 and 112 only above the photoelectric conversion units 121 and 122, as shown in FIG. 1A, allows light to be introduced to the photoelectric conversion units 121 and 122 more efficiently.

Although the ranging pixel 100, shown in FIG. 1A, has the microlenses 102 below the optical isolation layer 110, the microlenses 102 are not absolutely necessary in this embodiment. However, providing the microlenses 102 can introduce light to the photoelectric conversion units 121 and 122 more efficiently.

Although the ranging pixel 100, shown in FIGS. 1A and 1C, has the two waveguides 104 under the two microlenses 102, the waveguides 104 may be omitted or only one waveguide may be provided under the two microlenses 102. However, providing the plurality of waveguides 104 can efficiently introduce light to the photoelectric conversion units 121 and 122.

Figure 7B:
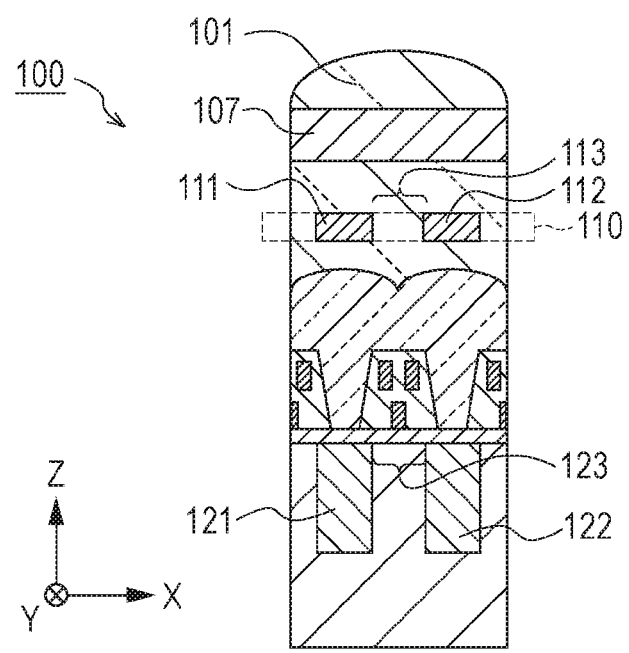
FIG. 7B is a schematic diagram showing yet another example of the ranging pixel according to the first embodiment.

As shown in FIG. 7B, the ranging pixel 100 may have a color filter 107 to obtain color information at the same time. Specifically, the color filter 107 may be disposed between the microlens 101 and the optical isolation layer 110 in such a manner as to be astride the photoelectric conversion units 121 and 122.

Figure 7C:
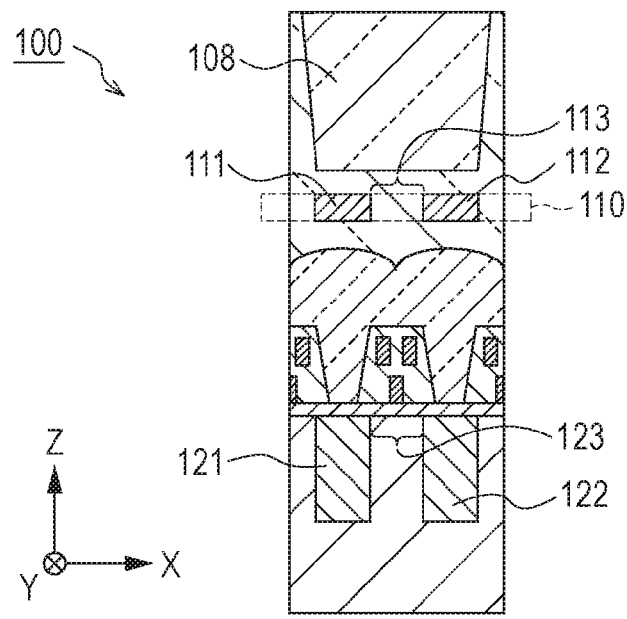
FIG. 7C is a schematic diagram showing still another example of the ranging pixel according to the first embodiment.

Instead of the microlens 101, a single waveguide 108 disposed astride the plurality of photoelectric conversion units 121 and 122 may be used as the pupil dividing unit, as shown in FIG. 7C. This waveguide 108 has the function of changing the mode of coupling light with the waveguide 108 depending on the incident direction. This allows light to be introduced to the plurality of different photoelectric conversion units 121 and 122 depending on the incident direction. However, using the microlens 101 as the pupil dividing unit, as shown in FIG. 1A, facilitate manufacture. However, if the ranging pixel is small, using the waveguide 108, as shown in FIG. 7C, can enhance the effect of pupil division.

Figure 7D:
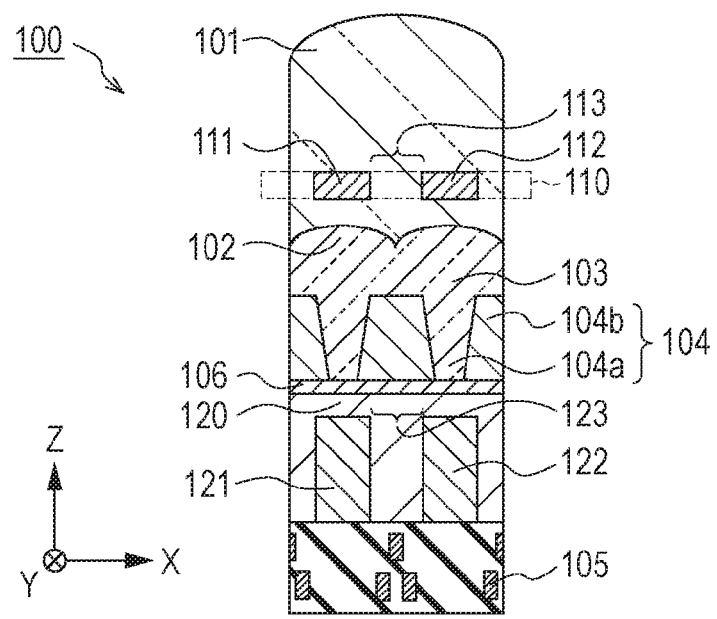
FIG. 7D is a schematic diagram showing still another example of the ranging pixel according to the first embodiment.

Although FIG. 1A shows an example of a surface-irradiation solid-state image sensor in which the wires 105 are disposed at the light incident side of the substrate 120, a backside-irradiation solid-state image sensor is possible in which the wires 105 are disposed opposite the light incident side of the substrate 120, as shown in FIG. 7D.

The ranging pixel 100, shown in FIG. 1A, has the wires 105 above the barrier area 123. In this case, the width of the barrier area 123 is larger than that simply for preventing the crosstalk between the plurality of photoelectric conversion units 121 and 122, to ensure a width for disposing the wires 105. Thus, without the optical isolation layer 110, the amount of light entering the barrier area 123 increases. Accordingly, application of the optical isolation layer 110 to the ranging pixel 100 in which the wires 105 are disposed above the barrier area 123 enhances the effect of the optical isolation layer 110 more. In other words, disposing the optical isolation layer 110 can increase the sensitivity of the ranging pixel 100 even if the barrier area 123 is wide, for example, in the case where the wires 105 are disposed above the barrier area 123.

Disposing the wires 105 above the barrier area 123 increases the flexibility of circuit design, thus allowing addition of the function of reducing noise and reduction of manufacturing costs.

Part of the plurality of ranging pixels 100 may be formed by rotating the ranging pixel 100 with the structure of the ranging pixel 100, shown in FIG. 1A, 90 degrees about the z-axis and dividing the exit pupil in the y-axis. A pixel in which the exit pupil is divided in the x-axis can measure the distance to a subject having contrast in the x-axis, and a pixel in which the exit pupil is divided in the y-axis can measure the distance to a subject having contrast in the y-axis.

Although the ranging pixel 100 in FIG. 1A has two photoelectric conversion units 121 and 122, three or more photoelectric conversion units may be provided. If three or more photoelectric conversion units are provided in the x-direction in FIG. 1A, the pupil of the imaging optical system can be divided more finely, allowing high-precision distance measurement.

Figure 8A:
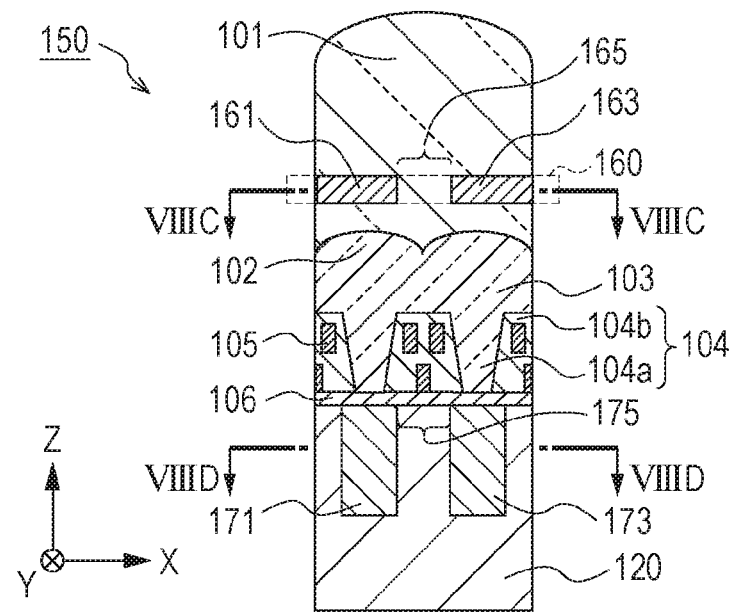
FIG. 8A is a schematic diagram showing another example of the ranging pixel according to the first embodiment.
Figure 8B:
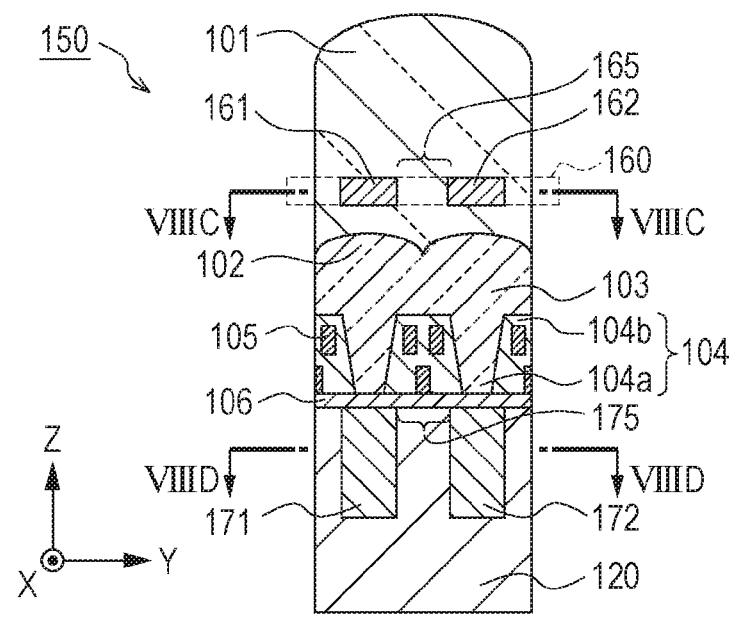
FIG. 8B is a schematic diagram showing yet another example of the ranging pixel according to the first embodiment.
Figure 8C:
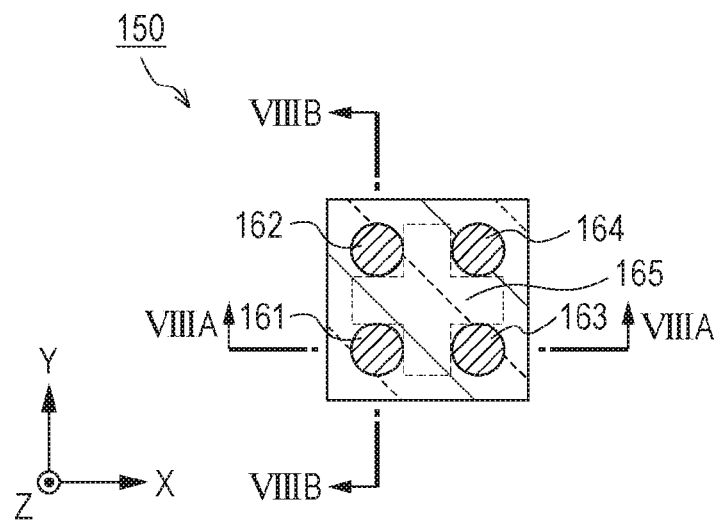
FIG. 8C is a cross-sectional view of the ranging pixel taken along an isolation layer.
Figure 8D:
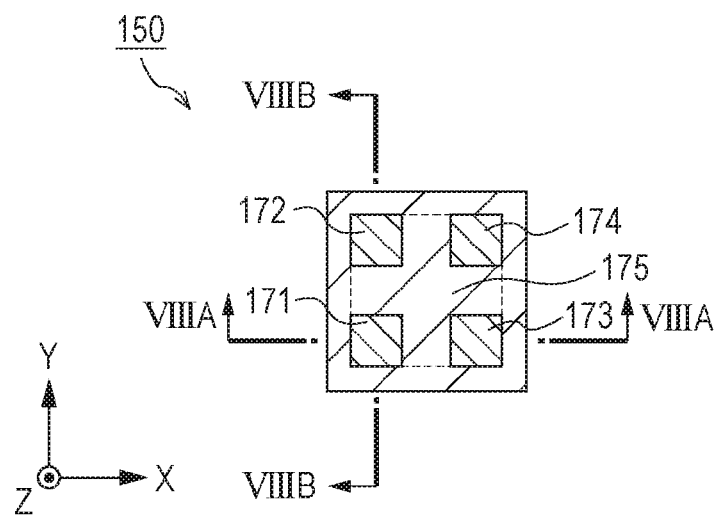
FIG. 8D is a cross-sectional view of the ranging pixel a on along photoelectric conversion units.

Alternatively, a plurality of photoelectric conversion units may be provided also in the y-direction in FIG. 1A. FIGS. 8A to 8D are schematic diagrams of a ranging pixel 150 including a plurality of photoelectric conversion units in the y-direction in addition to the x-direction. FIG. 8A is a cross-sectional view (the same as FIG. 1A) of the ranging pixel 150 taken long line x-z. FIG. 8B is a cross-sectional view of the ranging pixel 150 taken along line y-z. FIG. 8C is an x-y cross-sectional view of the ranging pixel 150 taken along an optical isolation layer 160. FIG. 8D is an x-y cross-sectional view of the ranging pixel 150 taken along photoelectric conversion units. In FIGS. 8C and 8D, a cross-sectional view taken along line V111A-V111A corresponds to FIG. 8A, and a cross-sectional view taken along V111B-V111B corresponds to FIG. 8B. In FIGS. 8A and 8B, a cross-sectional view taken along line V111C-V111C corresponds to FIG. 8C, and a cross-sectional view taken along line V111D-V111D corresponds to FIG. 8D. The ranging pixel 150 includes four photoelectric conversion units 171 to 174 and a barrier area 175 among the photoelectric conversion units 171 to 174. The microlens 101 is disposed so as to introduce light from a pupil area decentered from the optical axis of the imaging optical system in the +x-direction and the +y-direction to the photoelectric conversion unit 171. Similarly, a pupil area decentered from the optical axis of the imaging optical system in the +x-direction and the −y-direction is introduced to the photoelectric conversion unit 172. A pupil area decentered from the optical axis of the imaging optical system in the −x-direction and the +y-direction is introduced to the photoelectric conversion unit 173, and a pupil area decentered from the optical axis of the imaging optical system in the −x-direction and the −y-direction is introduced to the photoelectric conversion unit 174. Providing a plurality of photoelectric conversion units also in the y-direction, as in the ranging pixel 150, allows distance measurement of not only a subject having contrast in the x-direction but also a subject having contrast in the y-direction or a diagonal direction.

The optical isolation layer 160 has high-refractive-index areas 161 to 164 above the photoelectric conversion units 171 to 174, respectively. In other words, similarly to the ranging pixel 100, the optical isolation layer 160 is located between the microlens 101 and the plurality of photoelectric conversion units 171, 172, 173, and 174. In the optical isolation layer 160, a low-refractive-index area 165 is disposed among the high-refractive-index areas 161 to 164, Similarly to the ranging pixel 100, the refractive index changes stepwise at the boundary between the high-refractive-index areas 161 to 164 and the low-refractive-index area 165. This configuration allows light directed to the barrier area 175 to be suitably separated to the photoelectric conversion units 171 to 174, as with the ranging pixel 100. This can reduce degradation in image quality when the signals of the ranging pixel 150 are used as a captured image.

The high-refractive-index areas 161 to 164 may be either circular, as shown in FIG. 8C, or polygonal, such as rectangular. However, since the photoelectric conversion units 171 to 174 are normally rectangular in plan view, as shown in FIG. 8D, the high-refractive-index areas 161 to 164 may also be rectangular in plan view. The rectangular shape of the high-refractive-index areas 161 to 164 allows the shape of a portion at which the refractive index changes stepwise to coincide with the shape of the boundary between the barrier area 175 and the photoelectric conversion units 171 to 174. This allows light directed to the low-refractive-index area 165 to be efficiently separated to the high-refractive-index areas 161 to 164.

Relationship Between Ranging Pixel and Image-Capturing Pixel

Figure 9A:
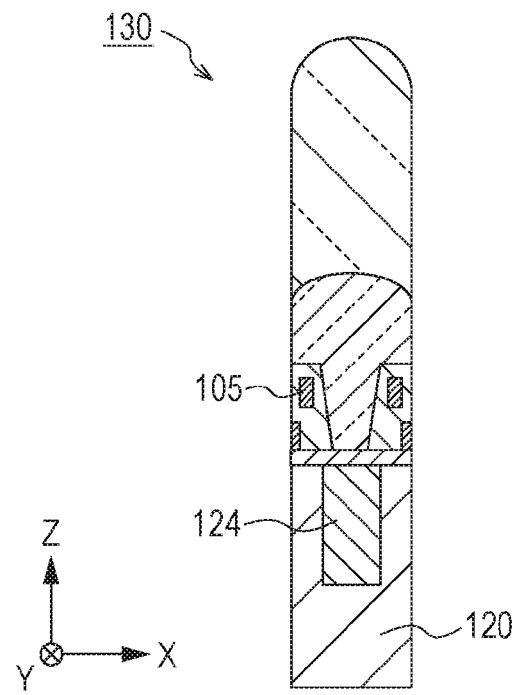
FIG. 9A is a schematic diagram showing an example of image-capturing pixels included in the solid-state image sensor according to the first embodiment.

The solid-state image sensor may have only the ranging pixel 100 (or the ranging pixel 150), described above; alternatively, it may have a general image-capturing pixel (imaging pixel) 130, as shown in FIG. 9A, in addition to the ranging pixel 100 or 150. In contrast to the ranging pixel 100 or 150, the image-capturing pixel 130 has a single photoelectric conversion unit 124 to detect light with the identical photoelectric conversion unit 124 irrespective of the incident direction of light.

Figure 9B:
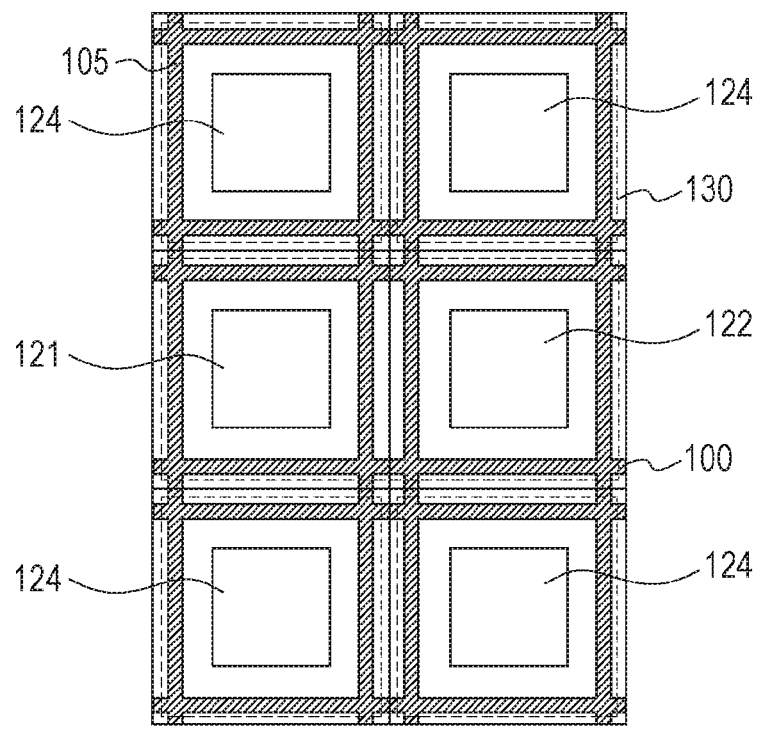
FIG. 9B is a schematic diagram showing another example of the solid-state image sensor according to the first embodiment.

With a configuration in which the solid-state image sensor has both the ranging pixel 100 and the image-capturing pixel 130, as shown in FIG. 9B, the wires 105 may be disposed above the barrier area 123. As shown in FIG. 9A, the wires 105 in the image-capturing pixel 130 are generally disposed outside the photoelectric conversion unit 124. If the wires 105 are disposed outside the photoelectric conversion units 121 and 122, not above the barrier area 123 in the ranging pixel 100, a misalignment in wiring pattern occurs between the ranging pixel 100 and the general image-capturing pixel 130 to complicate the circuit design, thus making it difficult to manufacture. Thus, the wires 105 are disposed in the barrier area 123 above the ranging pixel 100, thus enhancing the effect of the optical isolation layer 110.

Although FIG. 9B shows an example in which the ranging pixel 100 has a size corresponding to two image-capturing pixels 130, the image-capturing pixel 130 and the ranging pixel 100 may have the same size. However, the size of the ranging pixel 100 is preferably integer times as large as that of the image-capturing pixel 130 to have the same wiring pattern.

Image Capturing Apparatus

Figure 10:
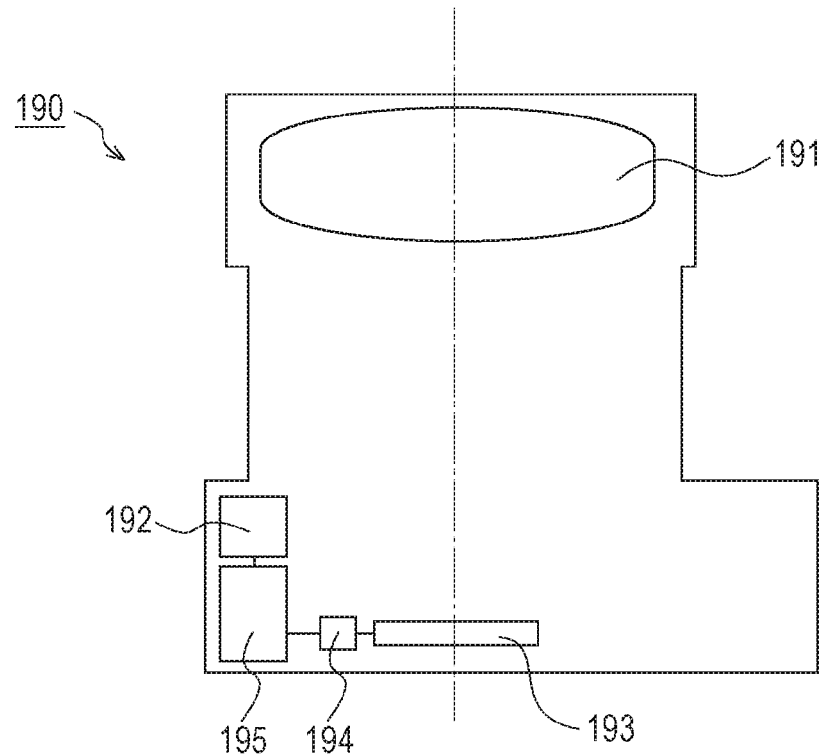
FIG. 10 is a schematic diagram of an image capturing apparatus including the solid-state image sensor according to the first embodiment.

FIG. 10 is a schematic diagram of an image capturing apparatus (imaging apparatus) 190 including the solid-state image sensor according to this embodiment. The image capturing apparatus 190 includes, in addition to a solid-state image sensor 193 having the ranging pixel 100, an imaging optical system 191, a CPU 192, a transfer circuit 194, and a signal processing unit 195. The CPU 192 controls the operation of the transfer circuit 194 and the signal processing unit 195. Distance measurement is performed such that the transfer circuit 194 transfers signals obtained with the photoelectric conversion units 121 and 122 to the signal processing unit 195, and the signal processing unit 195 forms various images and compares the images. The signals obtained by the photoelectric conversion units 121 and 122 are also processed by the signal processing unit 195 and are used as signals for the captured image.

Second Embodiment

Figure 11:
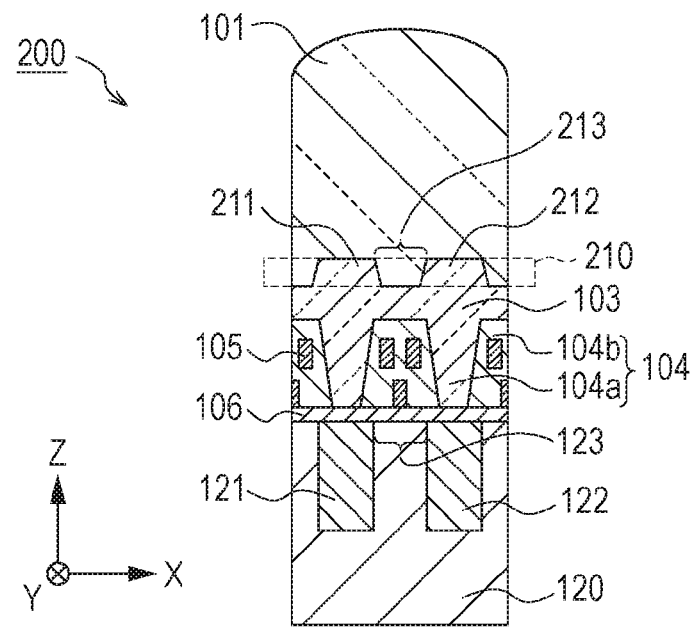
FIG. 11 is a schematic diagram of a ranging pixel of a solid-state image sensor according to a second embodiment.

FIG. 11 is a schematic diagram of a ranging pixel 200 disposed in part or all of a solid-state image sensor according to a second embodiment. The ranging pixel 200 according to this embodiment differs from the ranging pixel 100 of the first embodiment in that the microlenses 102 are omitted and that the waveguide top layer 103 and an optical isolation layer 210 connect to each other. The waveguide top layer 103 made of the same material as that of the cores 104a of the waveguides 104 is disposed on the waveguides 104. Thus, the optical isolation layer 210, the waveguide top layer 103, and the waveguides 104 connect to each other. This configuration eliminates the process of providing the microlenses 102 and allows the optical isolation layer 210 to be manufactured by removing part of the waveguide top layer 103, thus facilitating manufacture.

The waveguide top layer 103 is provided in the viewpoint of the manufacturing process and improvement in the sensitivity of the ranging pixel 200. This is because: light separated by the optical isolation layer 210 is refracted, not to the low-refractive-index area 213, toward the high-refractive-index areas 211 and 212 due to the stepwise-changing refractive index difference of the optical isolation layer 210; such light is inefficient in coupling with the mode of the waveguide 104, and direct coupling with the optical isolation layer 210 and the waveguides 104 without the presence of the waveguide top layer 103 hinders light refracted by the optical isolation layer 210 from coupling with the waveguides 104, thus causing a loss.

In contrast, with the presence of the waveguide top layer 103, the light refracted by the optical isolation layer 210 can be propagated in the waveguide top layer 103 and then gradually coupled with the waveguides 104. This allows the light separated by the optical isolation layer 210 to be efficiently introduced to the waveguides 104, thus further enhancing the sensitivity of the ranging pixel 200. In particular, the waveguide top layer 103 preferably has a thickness of 200 nm or more and 800 nm or less in terms of the manufacturing process and the sensitivity of the ranging pixel 200.

Manufacturing Method

Figure 12A:
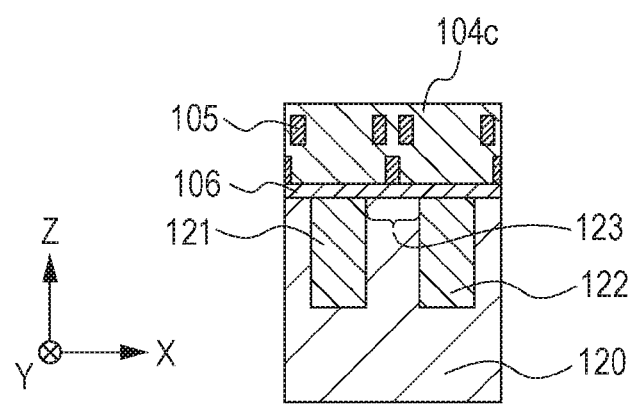
FIG. 12A is a schematic diagram showing a method for manufacturing the image-capturing pixel according to the second embodiment.
Figure 12B:
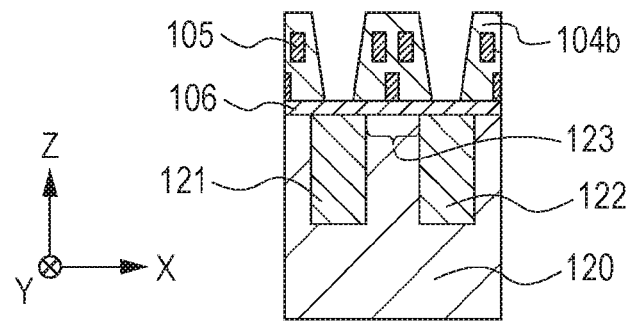
FIG. 12B is a schematic diagram showing the method for manufacturing the image-capturing pixel according to the second embodiment.

A specific method for manufacturing the ranging pixel 200 will be described with reference to FIGS. 12A to 12F. A detailed description of a method for manufacture of a known configuration will be omitted. First, as shown in FIG. 12A, the photoelectric conversion units 121 and 122 are formed in the substrate 120, and next the gettering layer 106, a clad member 104c, and the wires 105 are formed. Next, as shown in FIG. 12B, portions of the clad member 104c to be the cores 104a of the waveguides 104 are removed, with portions to be the clads 104b left, by photolithography and etching.

Figure 12C:
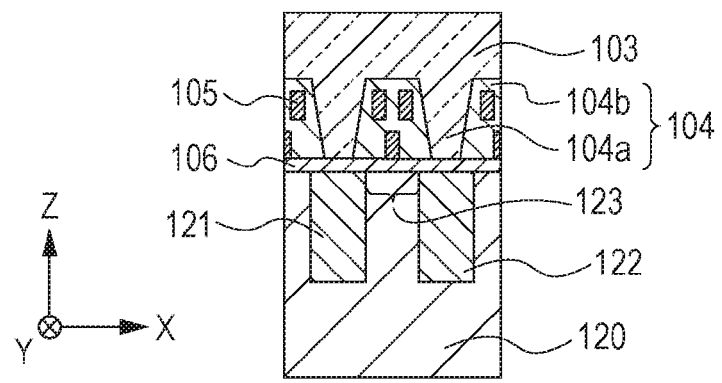
FIG. 12C is a schematic diagram showing the method for manufacturing the image-capturing pixel according to the second embodiment.

Subsequently, as shown in FIG. 12C, a material (for example, silicon nitride) having a refractive index higher than that of the removed clad member 104c (for example, silicon oxide) is deposited by chemical vapor deposition (CVD) or sputtering, and the surface of which is flattened by chemical mechanical polishing (CMP) or the like. In this process, the cores 104a are formed in the areas in which the clad member 104c is removed to form the waveguides 104 each formed of the core 104a and the clad 104b above the photoelectric conversion units 121 and 122. Furthermore, the waveguide top layer 103 formed of the same material as that of the cores 104a of the waveguides 104 is formed.

Figure 12D:
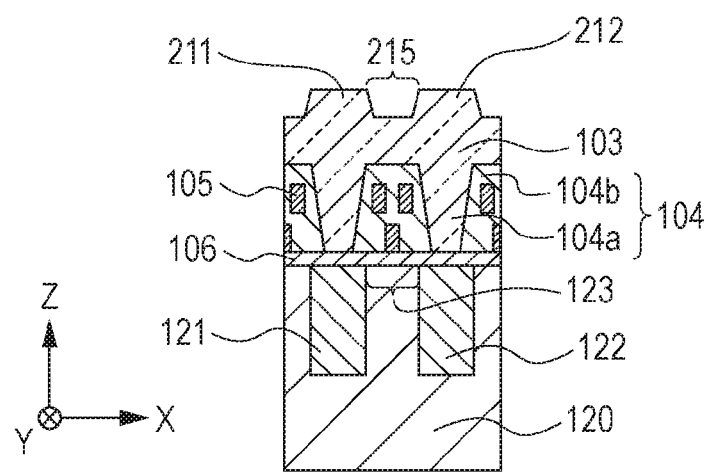
FIG. 12D is a schematic diagram showing the method for manufacturing the image-capturing pixel according to the second embodiment.
Figure 12E:
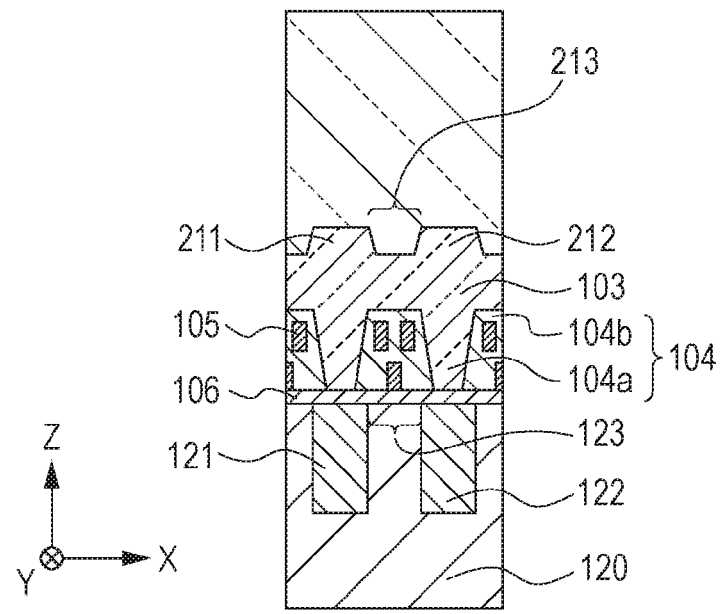
FIG. 12E is a schematic diagram showing the method for manufacturing the image-capturing pixel according to the second embodiment.
Figure 12F:
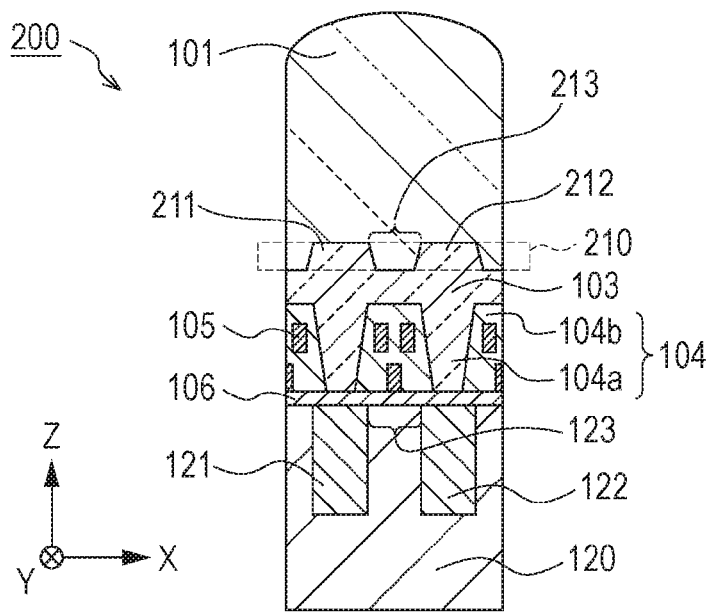
FIG. 12F is a schematic diagram showing the method for manufacturing the image-capturing pixel according to the second embodiment.

Thereafter, as shown in FIG. 12D, an area 215 of the waveguide top layer 103 above the barrier area 123 is removed by etching, with portions of the optical isolation layer 210 to be the high-refractive-index areas 211 and 212 left. Subsequently, as shown in FIG. 12E, the area 215 is filled with a material (for example, silicon oxide) having a lower refractive index than that of the high-refractive-index areas 211 and 212 to form the low-refractive-index area 213, thereby forming the optical isolation layer 210. Lastly, as shown in FIG. 12F, the microlens 101 is produced to manufacture the ranging pixel 200.

Third Embodiment

Figure 13A:
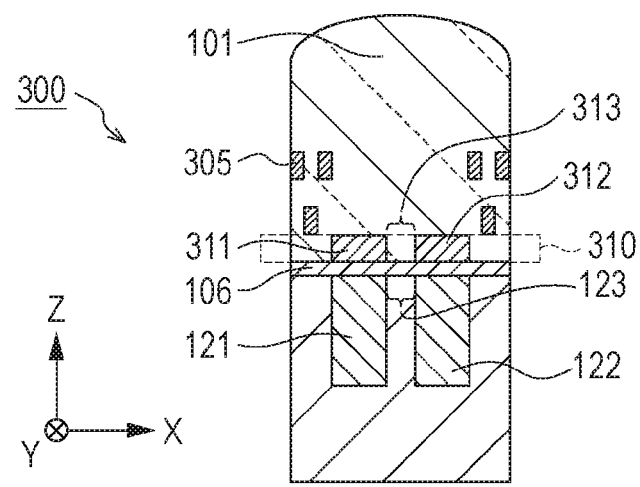
FIG. 13A is a schematic diagram of a ranging pixel of a solid-state image sensor according to a third embodiment.

Case where Optical Isolation Layer is Disposed Directly on Photoelectric Conversion Unit FIG. 13A is a schematic diagram of a ranging pixel 300 disposed in part or all of a solid-state image sensor according to a third embodiment. The ranging pixel 300 differs from the ranging pixel 100 of the first embodiment in that the microlenses 102, the waveguide top layer 103, and the waveguides 104 are omitted and that an optical isolation layer 310 is disposed directly above the photoelectric conversion units 121 and 122, with the gettering layer 106 therebetween. No wires are provided above the barrier area 123, and wires corresponding to the wires 105 above the barrier area 123 in FIG. 1A are formed of part of wires 305 outside the photoelectric conversion units 121 and 122.

The optical isolation layer 310 includes high-refractive-index areas 311 and 312 and a low-refractive-index area 313, in which the refractive index changes stepwise at the boundaries between the high-refractive-index areas 311 and 312 and the low-refractive-index area 313. This allows light directed to the barrier area 123 to be separated to the high-refractive-index areas 311 and 312. Since the separated light enters the photoelectric conversion units 121 and 122, the sensitivity of the ranging pixel 300 can be enhanced.

Figure 13B:
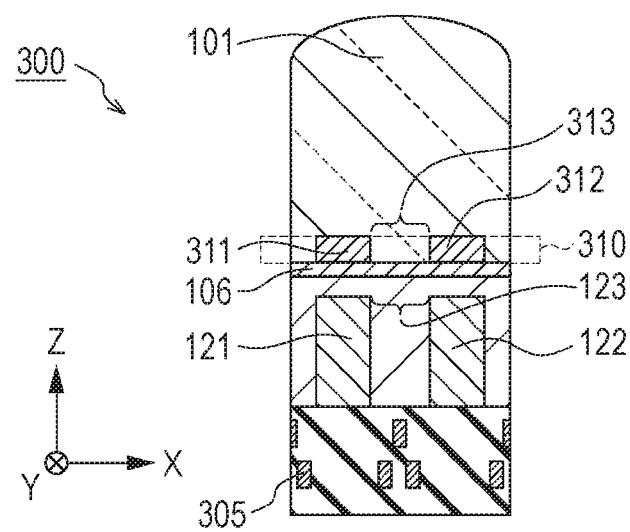
FIG. 13B is a schematic diagram of another example of the ranging pixel according to the third embodiment.
Figure 13C:
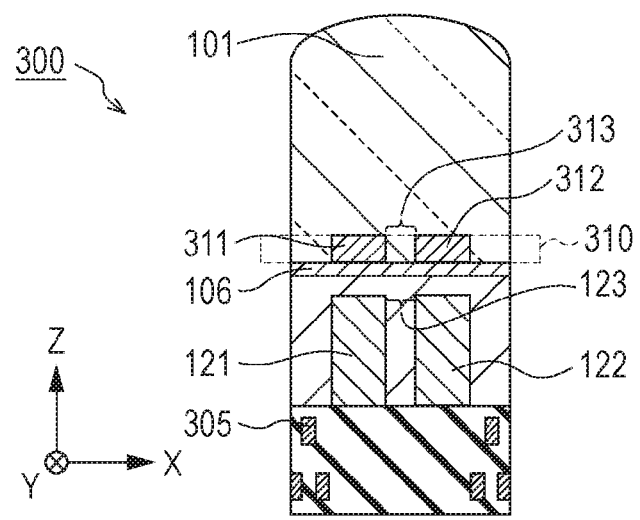
FIG. 13C is a schematic diagram of yet another example of the ranging pixel according to the third embodiment.

As shown in FIGS. 13B and 13C, the ranging pixel 300 may be applied to a backward-irradiation solid-state image sensor in which the wires 305 are disposed opposite the light incident side. FIG. 13B shows an example in which the wires 305 are provided below the barrier area 123; and FIG. 13C shows an example in which the wires below the barrier area 123 is are shifted to outside the photoelectric conversion units 121 and 122 to narrow the width of the barrier area 123.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-159139, filed Jul. 31, 2013, which is hereby incorporated by reference herein in its entirety.

REFERENCE SIGNS LIST 100, 150, 200, 300 Ranging pixel
101 Microlens
108 Waveguide
110 Optical isolation layer
111, 112, 161, 162, 163, 164, 311, 312 High-refractive-index area
113, 165, 313 Low-refractive-index area
121, 122, 171, 172, 173, 174 Photoelectric conversion unit
193 Solid-state image sensor

The invention claimed is:

1. A solid-state image sensor comprising:
a ranging pixel including a pupil dividing unit and a plurality of photoelectric conversion units, wherein
the pupil dividing unit is configured to divide light that has passed through an exit pupil of an imaging optical system;
the photoelectric conversion units are configured to receive the light that has passed though the pupil dividing unit;
the ranging pixel includes an optical isolation layer between the pupil dividing unit and the plurality of photoelectric conversion units, wherein the optical isolation layer includes a plurality of high-refractive-index areas and a low-refractive-index area having a lower refractive index than the refractive index of the high-refractive-index areas, the high-refractive-index areas being disposed above the plurality of photoelectric conversion units, and the low-refractive-index area being disposed between the plurality of the high-refractive-index areas;
the refractive index changes stepwise at the boundaries between the high-refractive-index areas and the low-refractive-index area;
the refractive index difference of the stepwise changing portion is 0.15 or more; and
a value obtained by multiplying the physical thickness of the optical isolation layer by the refractive index of the high-refractive-index areas is 2.0 or less times as large as the wavelength of incident light.

2. The solid-state image sensor according to claim 1, wherein the high-refractive-index areas are enclosed by the low-refractive-index area and a low refractive index medium disposed closer to the pupil dividing unit than the high-refractive-index areas.

3. The solid-state image sensor according to claim 1, wherein the refractive index difference of the stepwise change portion is 0.30 or more.

4. The solid-state image sensor according to claim 1, wherein the refractive index difference of the stepwise change portion is 0.50 or less.

5. The solid-state image sensor according to claim 1, wherein a value obtained by multiplying the physical thickness of the optical isolation layer by the refractive index difference of the stepwise change portion is 0.10 or more times as large as the wavelength of incident light.

6. The solid-state image sensor according to claim 1, wherein the low-refractive-index area has a width of 0.40 or more times as large as the distance between the plurality of photoelectric conversion units.

7. The solid-state image sensor according to claim 1, wherein the low-refractive-index area has a width of 1.4 or less times as large as the distance between the plurality of photoelectric conversion units.

8. The solid-state image sensor according to claim 1, wherein the stepwise change portion has a width equal to or less than the wavelength of incident light.

9. The solid-state image sensor according to claim 1, wherein the stepwise change portion has a width of 0.20 or less times as large as the wavelength of incident light.

10. The solid-state image sensor according to claim 1, wherein the high-refractive-index areas are disposed only above the plurality of photoelectric conversion units.

11. The solid-state image sensor according to claim 1, wherein the high-refractive-index areas extend to the outside of the plurality of photoelectric conversion units.

12. The solid-state image sensor according to claim 1, wherein the pupil dividing unit is a lens disposed astride the plurality of photoelectric conversion units.

13. The solid-state image sensor according to claim 1, wherein the pupil dividing unit is a waveguide disposed astride the plurality of photoelectric conversion units.

14. The solid-state image sensor according to claim 1, wherein the high-refractive-index areas of the optical isolation layer are rectangular in plan view.

15. The solid-state image sensor according to claim 1, further comprising a plurality of lenses between the optical isolation layer and the plurality of photoelectric conversion units, the lenses being corresponding to the plurality of photoelectric conversion units, respectively.

16. The solid-state image sensor according to claim 1, further comprising a plurality of waveguides between the optical isolation layer and the plurality of photoelectric conversion units, the waveguides being corresponding to the plurality of photoelectric conversion units, respectively.

17. The solid-state image sensor according to claim 16, further comprising a waveguide top layer between the waveguide and the optical isolation layer, the waveguide top layer being formed of the same material as that of a core of the waveguide, wherein the high-refractive-index areas, the waveguide top layer, and the waveguide are connected together.

18. The solid-state image sensor according to claim 17, wherein the waveguide top layer has a thickness of 200 nm or more and 800 nm or less.

19. The solid-state image sensor according to claim 1, further comprising a wire in an area corresponding to the area between the plurality of photoelectric conversion units.

20. The solid-state image sensor according to claim 1, further comprising an image-capturing pixel including a single photoelectric conversion unit.

21. The solid-state image sensor according to claim 20, wherein the ranging pixel has a size of integer times as large as the size of the image-capturing pixel.

22. The solid-state image sensor according to claim 20, wherein
the ranging pixel has a wire in an area corresponding to the area between the plurality of photoelectric conversion units;
the image-capturing pixel has a wire outside the photoelectric conversion unit; and
the wire in the ranging pixel and the wire in the image-capturing pixel have the same pattern.

23. An image capturing apparatus comprising an imaging optical system and the solid-state image sensor according to claim 1.

* * * * *